United States Patent
Furukawa

(10) Patent No.: US 6,697,287 B2
(45) Date of Patent: Feb. 24, 2004

(54) MEMORY CONTROLLER AND MEMORY SYSTEM APPARATUS

(75) Inventor: Hideyuki Furukawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/259,525

(22) Filed: Sep. 30, 2002

(65) Prior Publication Data

US 2003/0137874 A1 Jul. 24, 2003

(30) Foreign Application Priority Data

Jan. 21, 2002 (JP) ......................................... 2002-011176

(51) Int. Cl.$^7$ ................................................ G11C 7/00
(52) U.S. Cl. ........................... 365/189.05; 365/230.01; 711/200
(58) Field of Search ................... 365/189.05, 230.08, 365/230.01; 710/52; 711/200, 100

(56) References Cited

U.S. PATENT DOCUMENTS 5,913,229 A * 6/1999 Joo .............................. 711/200
6,256,681 B1 * 7/2001 Chang ............................ 710/1
6,496,443 B2 * 12/2002 Kim et al. ................... 365/233

* cited by examiner

Primary Examiner—Richard Elms
Assistant Examiner—Nam Nguyen
(74) Attorney, Agent, or Firm—Arent Fox Kintner Plotkin & Kahn

(57) ABSTRACT

A data buffer of a memory controller receives first program data, whose size is smaller than that of a page buffer, from a system, and holds the received data. A data adding circuit of the memory controller adds mask data to the first program data, to generate second program data whose size is equal to that of the page buffer. Since the mask data are not programmed to memory cells, only the first program data, which are supplied from the system, are programmed to pages of a nonvolatile semiconductor memory. Namely, even when the size of the page buffer of the nonvolatile semiconductor memory is large, it is possible to maintain interchangeability with an exiting system only by using the memory controller of the present invention.

6 Claims, 3 Drawing Sheets

MEMORY CONTROLLER AND MEMORY SYSTEM APPARATUS

BACKGROUND OF THE INVENTION

1. Field of the Invention

The present invention relates to a memory controller, which obtains access to a nonvolatile semiconductor memory based on an instruction from a system. Moreover, the present invention relates to a memory system apparatus on which the nonvolatile semiconductor memory and the memory controller are mounted.

2. Description of the Related Art

A memory controller converts a command, an address and the like, which are supplied from a system, into signals suited to a nonvolatile semiconductor memory, and obtains access to the nonvolatile semiconductor memory instead of the system. For example, a memory controller for controlling a NAND type flash memory (hereinafter also simply referred to as a flash memory) outputs a write command, an address, program data and so on sequentially to a data terminal of the flash memory based on an instruction from the system, during write operation (programming) of data.

The NAND type flash memory is mounted on, for example, a memory card, and is used for file storage. The memory controller for controlling the flash memory is mounted on the memory card. The memory controller determines a bit number of an address to be outputted to the flash memory and the like, according to a total memory capacity of the flash memory which is mounted on the memory card. Namely, interchangeability of the memory card is maintained by the memory controller.

Write operation and read operation to/from the NAND type flash memory are carried out for each page. A size of one page is 512 bytes, irrespective of the memory capacity of the flash memory. Hence, the memory controller outputs the program data, which are received from the system, to the flash memory in a unit of 512 bytes. One write operation to the flash memory (write operation of 512 bytes) requires about 200 µs. For example, in a flash memory of 64M bits, a few seconds are necessary to write data to all memory cells.

As described above, since the page size is fixed irrespective of the memory capacity of the flash memory, the number of pages increases as the memory capacity increases. Therefore, a write number and a write time of the data have the tendency to increase as the memory capacity increases. It is considered that the page size will increase in future in order to reduce the write number and shorten the write time.

When a flash memory with a large page size is developed and mounted on the memory card, it is necessary for this memory card to be used in an existing system. Specifically, an input/output interface of the memory card with the large page size needs to correspond to an input/output interface of an existing memory card, so as to maintain interchangeability. In order to respond to this need, it is necessary to develop a new memory controller. However, the memory controller for using by the existing system the memory card on which the flash memory with the large page size is mounted has not been developed.

SUMMARY OF THE INVENTION

It is an object of the present invention to provide a memory controller and a memory system apparatus, which can be used by an existing system even when a page size of a flash memory increases.

According to one of the aspects of the present invention, a memory controller controls a nonvolatile semiconductor memory including a plurality of pages having memory cells and a page buffer. The page buffer temporarily holds program data to be programmed to the pages. A data buffer of the memory controller receives first program data whose size is smaller than the size of the page buffer from a system, and holds the received data.

A data adding circuit of the memory controller adds mask data to the first program data to generate second program data whose size is equal to the size of the page buffer. The second program data are outputted to the page buffer. The mask data are the data, which are not programmed to the memory cells of the nonvolatile semiconductor memory. Hence, only the first program data, which are supplied from the system, are programmed to the pages of the nonvolatile semiconductor memory. Namely, even when the program data, which are outputted from the system, are smaller than the size of the page buffer, it is possible to properly program the program data to the nonvolatile semiconductor memory. In other words, even when the size of the page buffer of the nonvolatile semiconductor memory is increased, it is possible to maintain interchangeability with the exiting system only by using the memory controller of the present invention.

According to another aspect of the present invention, an address receiver circuit of the memory controller receives an address signal, which indicates where the first program data is to be stored in the page buffer, from the system. The data adding circuit of the memory controller adds the mask data to at least either a head or an end of the first program data, according to the address signal. Namely, by using the address signal from the system, the data adding circuit can be formed by a simple logic. For example, when the address signal indicates a head of the page buffer, the first program data are stored from the head of the page buffer, and the mask data are stored after the first program data.

According to another aspect of the present invention, an address receiver circuit of the memory controller receives an address signal, which indicates which of the pages is to be programmed the first program data, from the system. A flag generator of the memory controller generates a flag signal, which indicates which memory area in one of the pages is to be programmed the first program data, according to the address signal. The flag signal is programmed into one of a plurality of spare areas corresponding respectively to the pages of the nonvolatile semiconductor memory. Hence, it is possible for the system to recognize the memory area to which the first program data are programmed and to which the first program data are not programmed in the respective pages. Namely, even when the size of the page buffer of the nonvolatile semiconductor memory is increased, the system can easily manage program conditions of the nonvolatile semiconductor memory.

BRIEF DESCRIPTION OF THE DRAWINGS

The nature, principle, and utility of the invention will become more apparent from the following detailed description when read in conjunction with the accompanying drawings in which like parts are designated by identical reference numbers, in which.

DESCRIPTION OF THE PREFERRED EMBODIMENT

Figure 1:
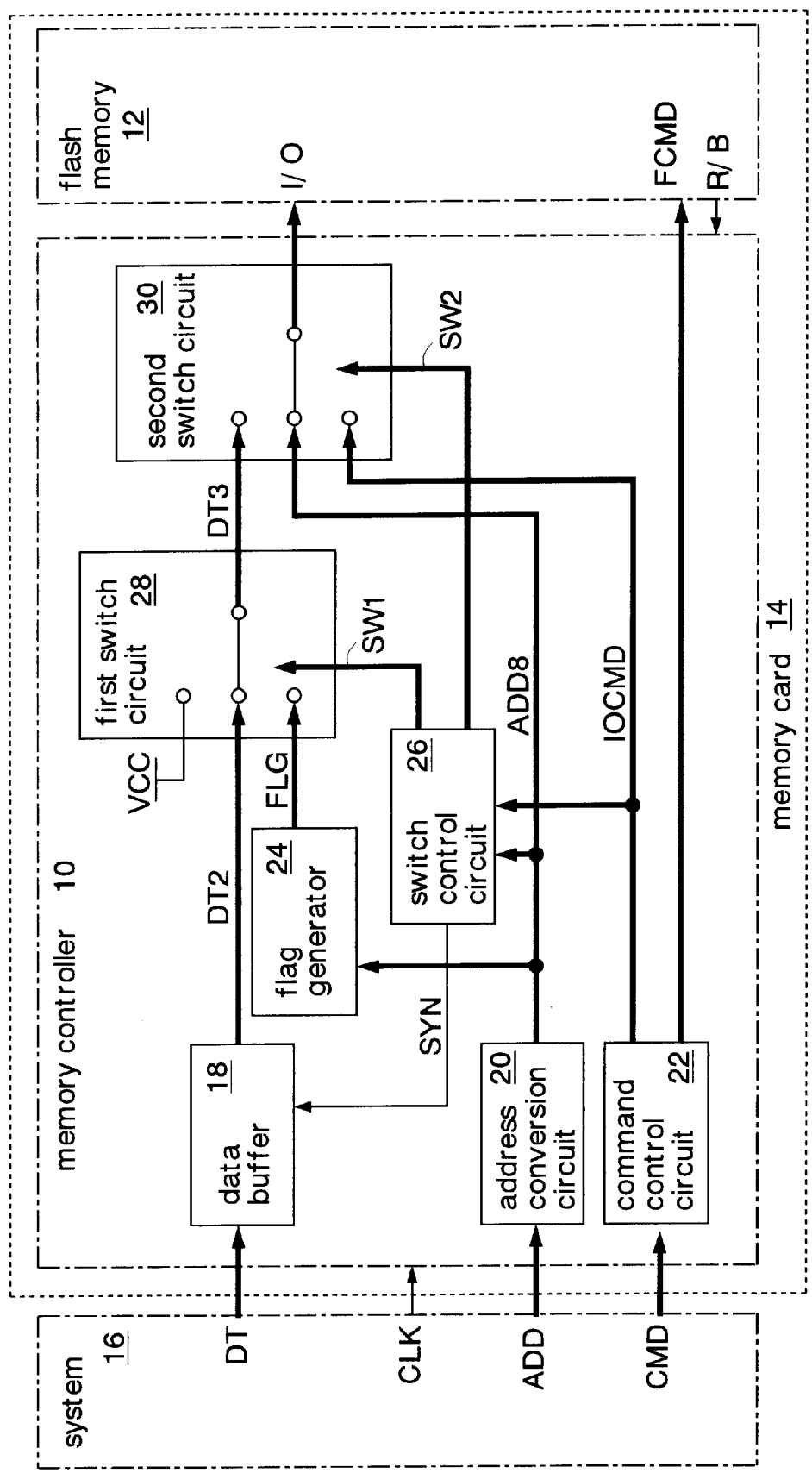
FIG. 1 is a block diagram showing an embodiment of the present invention.

Hereinafter, a preferred embodiment of the present invention will be explained with reference to the drawings. In the drawing, each of signal lines shown by bold lines consists of a plurality of lines. Some of blocks to which the bold lines are connected consist of a plurality of circuits.

FIG. 1 shows one embodiment of a memory controller and a memory system apparatus according to the present invention.

A memory controller 10 is mounted on a memory card 14 together with, for example, a NAND type flash memory 12. The memory card 14 is connected to a system 16, such as a personal computer and a digital camera, to be freely attachable and detachable, and operates as a memory system apparatus.

The system 16 has a slot (not shown) for an existing memory card. The flash memory 12 has, for example, an 8-bit data terminal I/O, a command terminal FCMD, and a ready/busy terminal R/B. A command latch enable signal, an address latch enable signal, a write enable signal and the like are supplied to the command terminal FCMD. The flash memory 12 has a plurality of pages each of whose memory capacity is 2 k bytes (four times as compared with a conventional art), as will be described later.

The memory controller 10 includes a data buffer 18, an address conversion circuit 20, a command control circuit 22, a flag generator 24, a switch control circuit 26, a first switch circuit 28, and a second switch circuit 30. The address conversion circuit 20 operates also as an address receiver circuit, which receives address signals ADD from the system 16. The switch control circuit 26 and the first switch circuit 28 operate as a data adding circuit.

The respective circuits of the memory controller 10 operate in synchronization with a clock CLK which is supplied from the system 16. Although not shown in the drawing, the memory controller 10 includes a control circuit concerning read operation of the flash memory 12, a control circuit of a ready/busy signal R/B outputted from the flash memory 12, and so on.

The data buffer 18 receives data signals DT of, for example, 32 bits from the system 16, and holds the received data signals DT. Then, the data buffer 18 outputs the held data signals DT as data signals DT2, in synchronization with a synchronous signal SYN. The data signals DT2 are outputted in a unit of 8 bits. The data signals DT and DT2 are first program data supplied from the system 16.

The address conversion circuit 20 receives the address signals ADD indicating an address of initial program data from the system 16. The address conversion circuit 20 converts the received signals ADD into address signals ADD8, which correspond to 8-bit data, and outputs the converted signals ADD8 to the switch control circuit 26 and the second switch circuit 30. The address signal ADD8 is generated by, for example, adding 2 bits to a low order of the address signal ADD.

The command control circuit 22 receives command signals CMD from the system 16, converts the received command signals CMD into commands which can be recognized by the flash memory 12, and outputs them as command signals FCMD. Additionally, the command control circuit 22 generates command signals IOCMD, which are supplied via the data terminal I/O of the flash memory 12, according to the command signals CMD, and outputs the generated signals IOCMD to the second switch circuit 30. For example, during write operation, "80" and "10" in hexadecimal are sequentially generated as the command signals IOCMD.

The flag generator 24 generates flag signals FLG according to the address signals ADD8 from the address conversion circuit 20. The details of the flag signals FLG will be described later.

The switch control circuit 26 receives the address signals ADD8 from the address conversion circuit 20, and generates the synchronous signal SYN and switching signals SW1. Additionally, the switch control circuit 26 receives the command signals IOCMD from the command control circuit 22, and generates switching signals SW2.

The first switch circuit 28 selects any one of a power supply voltage VCC (mask data), the data signals DT2, and the flag signals FLG according to the switching signals SW1, and outputs the selected signals as data signals DT3 (second program data).

The second switch circuit 30 selects any one of the data signals DT3, the address signals ADD8, and the command signals IOCMD according to the switching signals SW2, and outputs the selected signals as data signals I/O.

Figure 2:
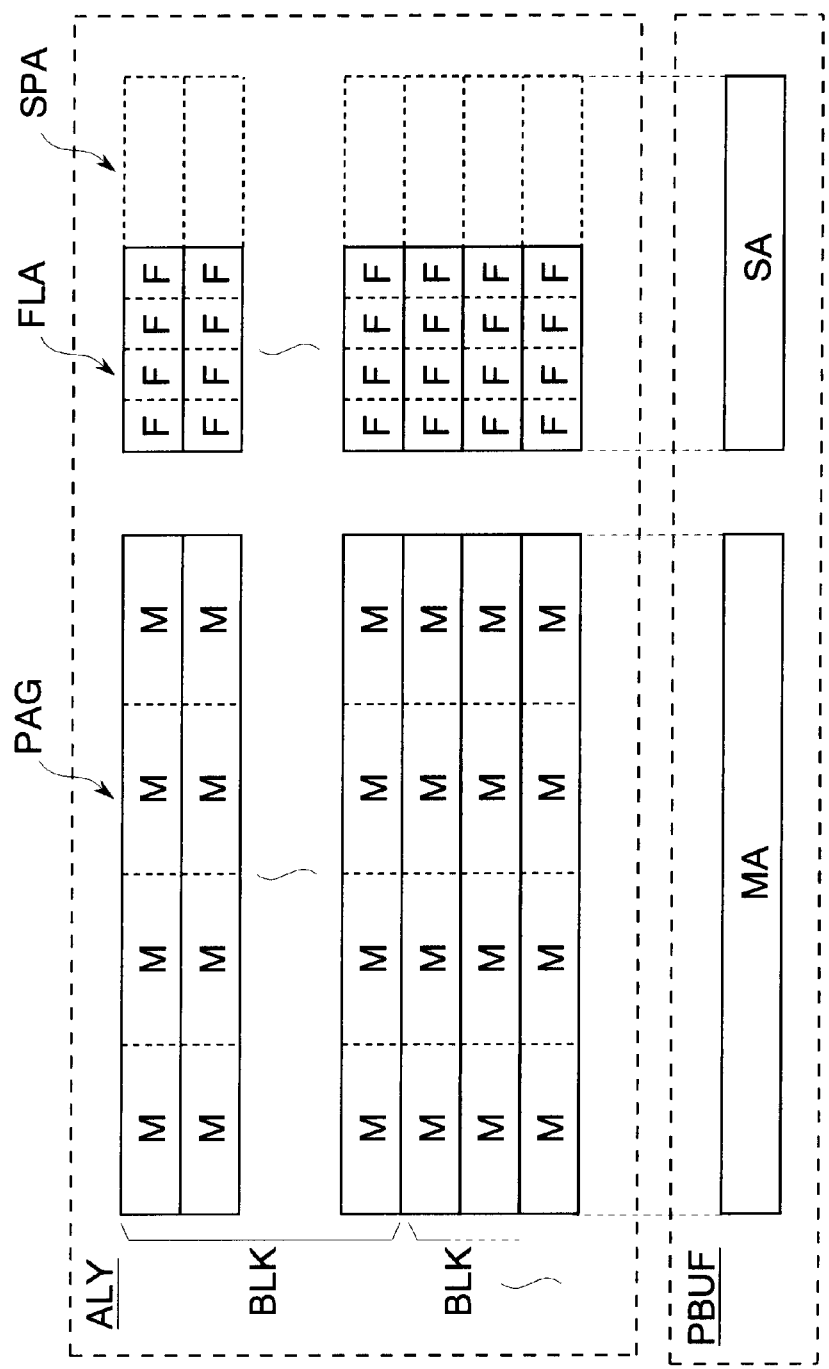
FIG. 2 is an explanatory view showing a flash memory in FIG. 1.

FIG. 2 shows the details of the flash memory 12 shown in FIG. 1. The flash memory 12 includes a memory cell array ALY and a page buffer PBUF (which is also referred to as a data register) which temporarily holds data to be programmed in the memory cell array ALY.

The memory cell array ALY includes a plurality of pages PAG having memory cells, and a plurality of spare areas SPA corresponding to the respective pages PAG. A plurality of the pages PAG and a plurality of the corresponding spare areas SPA form a plurality of blocks BLK.

Each of the pages PAG has a memory capacity of 2 k bytes. In this example, each of the pages PAG is divided into four memory areas M1, M2, M3, and M4, each of whose size is 512 bytes, in order to simplify the following explanation. Incidentally, the page size is not limited to 2 k bytes, but it may be, for example, 1 k bytes or 4 k bytes.

Each of the spare areas SPA has a memory capacity of 16 bytes. A flag area FLA is allocated to 4 bits of each spare area SPA. Flags F, which correspond to the memory areas M1 to M4, are allocated to the flag area FLA. Each of the flags F shows "0" when valid data is written into the corresponding memory area M1 to M4, and shows "1" when the valid data is not written into the corresponding memory area M1 to M4.

The page buffer PBUF includes a main area MA of 2 k bytes, which corresponds to the pages PAG, and a sub area SA of 16 bytes, which corresponds to the spare areas SPA. A capacity of the main area MA of the page buffer PBUF is four times larger than that of the conventional art. The program data (second program data) which are outputted from the memory controller 10 are temporarily written into the page buffer PBUF, and thereafter, written into the page PAG and the spare area SPA corresponding to the address.

Figure 3:
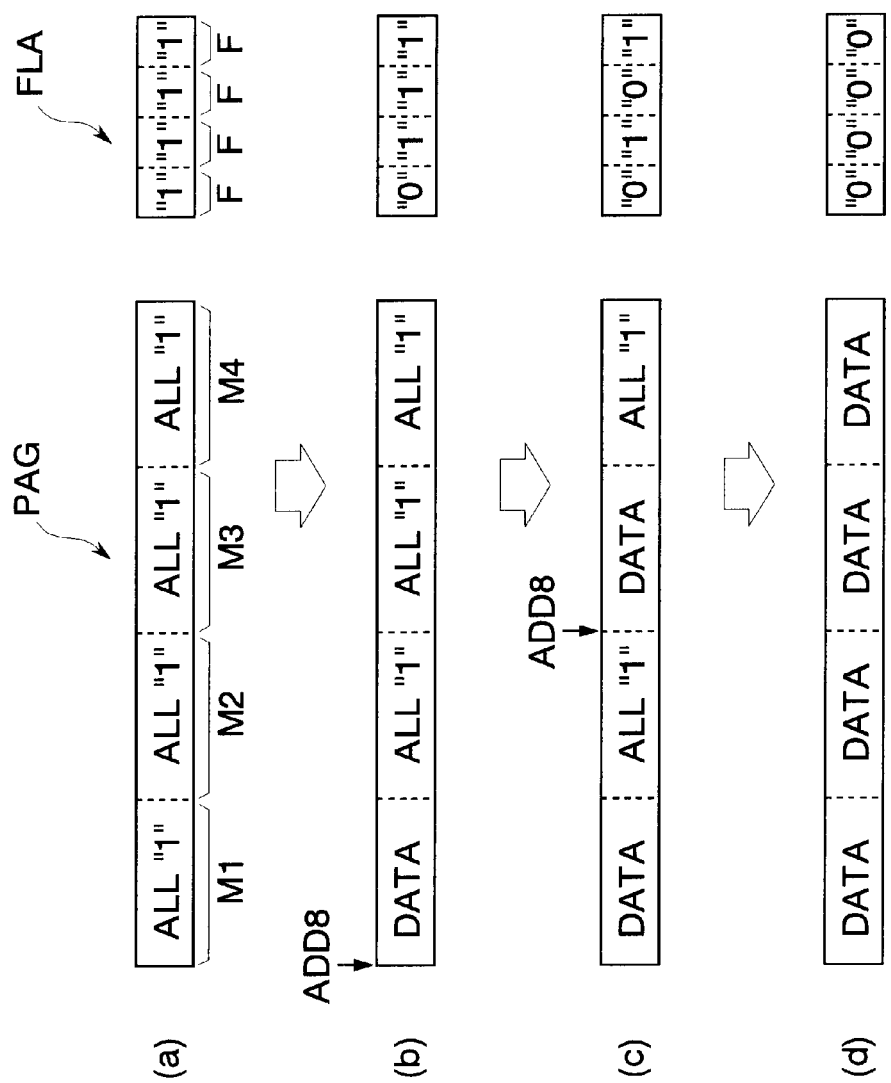
FIG. 3 is an explanatory view showing operation of the present invention.

FIG. 3 shows how the data are sequentially programmed to a predetermined page PAG of the flash memory 12 by the control of the memory controller 10. In an initial state (a), the data are not programmed to the flash memory 12, and "1" data are stored in all of the memory areas M1 to M4 of the page PAG (ALL"1"). "1" data are also stored in all of the flags F of the flag area FLA.

The system 16 shown in FIG. 1 is the existing system. Therefore, it recognizes that all the page sizes of the flash memory in the attached memory card are 512 bytes, and obtains access to the memory card. Namely, the system 16 successively outputs the program data in a unit of 512 bytes to the memory card 14.

First, the command control circuit 22 shown in FIG. 1 decodes the command signals CMD from the system 16, and outputs the command signals FCMD and IOCMD. The switch control circuit 26 changes the switching signals SW2 in synchronization with the command signals IOCMD. The second switch circuit 30 switches its switch according to the switching signals SW2, and transmits the command signals IOCMD (page program command "80") to the data terminal I/O of the flash memory 12.

The data buffer 18 successively receives the data of 512 bytes by 32 bits from the system 16. The address conversion circuit 20 receives the address signals ADD from the system 16, and outputs the address signals ADD8, which indicate a start address of the data to be programmed. In this example, as shown in FIG. 3(b), the address signals ADD8 indicate a head of the memory area M1.

Next, the switch control circuit 26 changes the switching signals SW1 and SW2, and switches the switches of the first and the second switch circuits 28 and 30. Moreover, the switch control circuit 26 outputs the synchronous signal SYN for outputting the data to the data buffer 18. The data buffer 18 successively outputs the data signals DT2 in synchronization with the synchronous signal SYN.

The first switch circuit 28 switches its switch according to the switching signals SW1, and outputs the data signals DT2 as the data signals DT3. The second switch circuit 30 switches its switch according to the switching signals SW2, and transmits the data signals DT3 successively to the date terminal I/O of the flash memory 12.

After the data of 512 bytes are transferred to the flash memory 12, the switch control circuit 26 changes the switching signals SW1. The first switch circuit 28 switches its switch according to the switching signals SW1, and outputs the data at a high level (power supply voltage VCC) as the data signals DT3. Then, the data signals DT3 of 1536 bytes at the high level are outputted to the flash memory 12. The data signals DT3 are the mask data, which are not programmed even when they are given to the memory cells.

Thus, the memory controller 10 adds the mask data to the data of 512 bytes which are received from the system 16, and transfers them to the flash memory as the data of 2 k bytes. Therefore, even in the memory card 14 on which the flash memory 12, whose size of the page PAG is larger than that of the conventional art, is mounted, it is possible to program the data to the flash memory 12 without changing the existing system 16. Namely, interchangeability of the memory card 14 is maintained.

Next, the switch control circuit 26 changes the switching signals SW1. The first switch circuit 28 switches its switch according to the switching signals SW1, and outputs the flag signals FLG from the flag generator 24 as the data signals DT3.

Thereafter, the command control circuit 22 outputs the page program command, which provides an instruction to start write operation, as the command signals IOCMD. The second switch circuit 30 switches its switch according to the switching signals SW2, and transmits the page program command "10" to the data terminal I/O of the flash memory 12. Then, program operation of the flash memory 12 is carried out, and data "DATA" is programmed only to the memory area M1 of the page PAG, as shown in FIG. 3(b). Additionally, in the flag area FLA, the flag F that corresponds to the memory area M1 (leftmost side of the drawing) is programmed.

Similarly, the next data of 512 bytes are transferred from the system 16 to the memory card 14. The command control circuit 22 outputs the command signals FCMD and IOCMD according to the command signals CMD from the system 16. The command signals FCMD and IOCMD are supplied to the command terminal FCMD and to the data terminal I/O of the flash memory 12, respectively.

The data buffer 18 successively receives the data of 512 bytes. The address conversion circuit 20 outputs the address signals ADD8, which indicate the start address of the program, according to the address signals ADD. In this example, as shown in FIG. 3(c), the address signals ADD8 indicate a head of the memory area M3.

Next, the first and the second switch circuits 28 and 30 are switched, and the data signals DT3 (mask data) of 1024 bytes at the high level are outputted to the flash memory 12. Namely, all the data corresponding to the memory areas M1 and M2 become the mask data. Therefore, it is possible to prevent the data DATA which is already programmed to the memory area M1 from being rewritten.

Thereafter, the first switch circuit 28 is switched, and the data signals DT2 of 512 bytes, which are held in the data buffer 18, are successively transmitted to the data terminal I/O of the flash memory 12. The data of 512 bytes are the data to be programmed to the memory area M3.

After the data of 512 bytes are transferred to the flash memory 12, the first switch circuit 28 is switched, and the data signals DT3 (mask data) of 512 bytes at the high level are outputted to the flash memory 12. Namely, all the data corresponding to the memory area M4 become the mask data. Next, the first switch circuit 28 is switched, and the flag signals FLG are outputted as the data signals DT3.

Then, program operation of the flash memory 12 is carried out, and data "DATA" is programmed only to the memory area M3 of the page PAG, as shown in FIG. 3(c). Additionally, in the flag area FLA, the flag F that corresponds to the memory area M3 (third to the left in the drawing) is programmed. As described above, the memory area M1 to which the data is already programmed is supplied with the mask data at the high level, and hence it is not programmed.

Thereafter, similarly to the above, program operation is carried out every 512 bytes, and the data are programmed to all the memory areas M1 to M4 of the page PAG, as shown in FIG. 3(d). At this time, all the flags F of the flag area FLA are programmed.

According to the above-described embodiment, the mask data are added to the program data, which are supplied from the system 16. Hence, even when the program data which are outputted from the system 16 are smaller than the size of the page buffer PBUF, it is possible to properly program the program data to the flash memory 12. Therefore, even when the size of the page buffer PBUF of the flash memory 12 which is mounted on the memory card 14 increases, the system 16 can program the program data similarly to a conventional memory card. Namely, interchangeability with the conventional memory card can be maintained.

The switch control circuit 26 controls the first switch circuit 28 according to the address signals ADD (ADD8) from the system 16, and adds the mask data (VCC) to the program data DT (DT2) from the system 16. Hence, the mask data can be added by the simple first switch circuit 28.

The flag generator 24 generates the flag signals FLG, indicating the memory area M to which the program data DT (DT2) from the system 16 are programmed, according to the address signals ADD (ADD8) from the system 16. Then, the memory controller 10 programs the flag signals FLG as the flag F to the flag area FLA of the flash memory 12. Hence, it is possible for the system 16 to recognize the memory area to which the program data DT are programmed and the memory area to which the program data DT are not programmed, only by reading the flag F which is stored in the flag area FLA. Namely, even when a flash memory which has a large size of the page buffer PBUF is developed, the system 16 can manage program conditions of this flash memory.

The invention is not limited to the above embodiment and various modifications may be made without departing from the spirit and scope of the invention. Any improvement may be made in part or all of the components.

What is claimed is:

1. A memory controller for controlling a nonvolatile semiconductor memory including a plurality of pages having memory cells and a page buffer for temporarily holding program data to be programmed to the pages, the memory controller comprising:

a data buffer for holding first program data which are supplied from a system and whose size is smaller than the size of said page buffer; and a data adding circuit for adding mask data, which are not programmed to said memory cells, to said first program data to generate second program data whose size is equal to the size of said page buffer, and for outputting the generated second program data to said page buffer.

2. The memory controller according to claim 1, further comprising an address receiver circuit for receiving an address signal from said system, said address signal indicating where said first program data is to be stored in said page buffer, wherein said data adding circuit adds said mask data to at least one of a head and an end of said first program data, according to said address signal.

3. The memory controller according to claim 1, further comprising:

an address receiver circuit for receiving an address signal from said system, said address signal indicating which of said pages is to be programmed said first program data; and a flag generator for generating a flag signal which indicates which memory area in one of said pages is to be programmed said first program data, the flag signal generated according to said address signal, wherein said flag signal is programmed into one of a plurality of spare areas corresponding respectively to said pages of said nonvolatile semiconductor memory.

4. A memory system apparatus on which a nonvolatile semiconductor memory and a memory controller are mounted, wherein:

said nonvolatile semiconductor memory includes a plurality of pages having memory cells and a page buffer for temporarily holding program data to be programmed to the pages; and said memory controller includes:

a data buffer for holding first program data which are supplied from a system and whose size is smaller than the size of said page buffer; and a data adding circuit for adding mask data, which are not programmed to said memory cells, to said first program data to generate second program data whose size is equal to the size of said page buffer, and for outputting the generated second program data to said page buffer.

5. The memory system apparatus according to claim 4, wherein:

said memory controller includes an address receiver circuit for receiving an address signal from said system, said address signal indicating where said first program data is to be stored in said page buffer; and said data adding circuit adds said mask data to at least one of a head and an end of said first program data, according to said address signal.

6. The memory system apparatus according to claim 4, wherein:

said memory controller includes:

an address receiver circuit for receiving an address signal from said system, said address signal indicating which of said pages is to be programmed said first program data; and a flag generator for generating a flag signal which indicates which memory area in one of said pages is to be programmed said first program data, the flag signal generated according to said address signal;

said nonvolatile semiconductor memory includes a plurality of spare areas corresponding respectively to said pages; and said flag signal is programmed into one of said spare areas.

\* \* \* \* \*